(12) United States Patent
Nagayama

(10) Patent No.: US 10,432,182 B2
(45) Date of Patent: Oct. 1, 2019

(54) SEMICONDUCTOR INTEGRATED CIRCUIT

(71) Applicant: SOCIONEXT INC., Kanagawa (JP)

(72) Inventor: Jun Nagayama, Kanagawa (JP)

(73) Assignee: Socionext, Inc., Kanagawa (JP)

( * ) Notice: Subject to any disclaimer, the term of this patent is extended or adjusted under 35 U.S.C. 154(b) by 0 days.

(21) Appl. No.: 16/194,649

(22) Filed: Nov. 19, 2018

(65) Prior Publication Data

US 2019/0089341 A1    Mar. 21, 2019

Related U.S. Application Data

(63) Continuation of application No. PCT/JP2017/017484, filed on May 9, 2017.

(30) Foreign Application Priority Data

May 20, 2016   (JP) .................. 2016-101795
Feb. 8, 2017    (JP) .................. 2017-021274

(51) Int. Cl.
| | | |
|---|---|---|
| *H03K 5/135* | (2006.01) | |
| *H03K 5/14* | (2014.01) | |
| *H01L 27/04* | (2006.01) | |
| *H03K 5/00* | (2006.01) | |
| *G06F 1/3237* | (2019.01) | |

(52) U.S. Cl.
CPC .......... *H03K 5/135* (2013.01); *G06F 1/3237* (2013.01); *H01L 27/04* (2013.01); *H03K 5/00* (2013.01); *H03K 5/14* (2013.01); *H03K 2005/00234* (2013.01)

(58) Field of Classification Search
CPC combination set(s) only.
See application file for complete search history.

(56) References Cited

U.S. PATENT DOCUMENTS

| | | | |
|---|---|---|---|
| 6,720,811 B2 * | 4/2004 | Yazawa ................... | G06F 1/10 327/161 |
| 2009/0031155 A1 | 1/2009 | Hofmann et al. | |
| 2013/0241690 A1 | 9/2013 | Wallace et al. | |

FOREIGN PATENT DOCUMENTS

| | | |
|---|---|---|
| JP | 2005-106545 A | 4/2005 |
| JP | 2005-310970 A | 11/2005 |
| JP | 2012-195751 A | 10/2012 |

OTHER PUBLICATIONS

Minki Cho et al., "Post-Silicon Voltage-Guard- Band Reduction in a 22nm Graphics Execution Core Using Adaptive Voltage Scaling and Dynamic Power Gating", IEEE, ISSCC(International Solid-State Circuits Conference) Feb. 2, 2016, p. 152-153.
Written Opinion issued in in Internaltional Application No. PCT/JP2017/017484 dated Aug. 1, 2017, with English translation.
International Search Report issued in Application No. PCT/JP2017/017484 dated Aug. 1, 2018, with English translation.

* cited by examiner

*Primary Examiner* — An T Luu
(74) *Attorney, Agent, or Firm* — McDermott Will & Emery LLP

(57) ABSTRACT

In a monitor circuit, a data signal is propagated from an FF to another FF via a data delay circuit. The data delay circuit selects any one from among data paths that delay the data signal in accordance with a selection signal. A clock signal that is input to the FF is input to the other FF via a clock delay circuit. The clock delay circuit selects any one from among clock paths that delay the clock signal in accordance with another selection signal.

8 Claims, 12 Drawing Sheets

SEMICONDUCTOR INTEGRATED CIRCUIT

CROSS-REFERENCE TO RELATED APPLICATION

This is a continuation of International Application No. PCT/JP2017/017484 filed on May 9, 2017, which claims priority to Japanese Patent Application No. 2016-101795 filed on May 20, 2016 and Japanese Patent Application No. 2017-021274 filed on Feb. 8, 2017. The entire disclosures of these applications are incorporated by reference herein.

The present disclosure relates to a semiconductor integrated circuit including a replica delay monitor that is configured to implement a critical path in a simulated manner.

BACKGROUND

In recent years, a semiconductor chip is equipped with a timing monitor that can confirm whether data is properly propagated in a simulated manner, for the purpose of reducing power consumption of the semiconductor chip. For example, Minki Cho et al., "Post-Silicon Voltage-Guard-Band Reduction in a 22 nm Graphics Execution Cores Using Adaptive Voltage Scaling and Dynamic Power Gating", IEEE, ISSCC (International Solid-State Circuits Conference) 2016, 2016 discloses a replica delay monitor that detects the presence or absence of a setup error by simulating a critical path in a semiconductor chip. This replica delay monitor can confirm the presence or absence of a setup error by setting a delay, in a data path between two flip-flops, the same as a delay in the critical path. By obtaining a result of determination made by the replica delay monitor while lowering power voltage of the semiconductor chip, lower power voltage can be set while maintaining the performance of the semiconductor chip.

SUMMARY

The replica delay monitor disclosed in Minki Cho et al., "Post-Silicon Voltage-Guard-Band Reduction in a 22 nm Graphics Execution Cores Using Adaptive Voltage Scaling and Dynamic Power Gating", IEEE, ISSCC (International Solid-State Circuits Conference) 2016, 2016 is merely able to adjust a delay in a data path between two flip-flops in accordance with a delay in a critical path. On the other hand, with respect to critical paths to hold errors, which are on the increase due to increased variation in processes, such a confirmation cannot be made with the replica delay monitor that can only adjust a delay in a data path.

In addition, the replica delay monitor disclosed in Minki Cho et al., "Post-Silicon Voltage-Guard-Band Reduction in a 22 nm Graphics Execution Cores Using Adaptive Voltage Scaling and Dynamic Power Gating", IEEE, ISSCC (International Solid-State Circuits Conference) 2016, 2016 may erroneously judge that a proper operation has been made even though proper data propagation has not been made, when the flip-flops are in what are called metastable states.

An object of the present disclosure is to improve the performance of a replica delay monitor equipped in a semiconductor integrated circuit, compared to conventional ones.

According to an aspect of the present disclosure, a semiconductor integrated circuit includes a monitor circuit configured to determine presence or absence of a data propagation error, the monitor circuit including: a first flip-flop having a clock terminal receiving a first clock signal; a data delay circuit configured to delay a first data signal that is an output of the first flip-flop; a clock delay circuit configured to delay the first clock signal; and a second flip-flop having (i) a data input terminal receiving an output signal of the data delay circuit, and (ii) a clock terminal receiving an output signal of the clock delay circuit, the data delay circuit including: a plurality of data paths each configured to delay the first data signal; and a data selection circuit configured to select a data path among the plurality of data paths in accordance with a first selection signal, and output the first data signal that has transmitted through a selected data path as an output signal of the data delay circuit, and the clock delay circuit including: a plurality of clock paths each configured to delay the first clock signal; and a clock selection circuit configured to select a clock path among the plurality of clock paths in accordance with a second selection signal, and output the first clock signal that has transmitted through the selected clock path as an output signal of the clock delay circuit.

According to this aspect, in the monitor circuit, the first data signal is propagated from the first flip-flop to the second flip-flop via the data delay circuit. The data delay circuit includes a plurality of data paths each delaying the first data signal, and any one from among the plurality of data paths is selected in accordance with the first selection signal. More specifically, a delay in the data paths can be adjusted. In addition, the first clock signal that is input to the first flip-flop is input to the second flip-flop via the clock delay circuit. The clock delay circuit includes a plurality of clock paths each delaying the first clock signal, and any one from among the plurality of clock paths is selected in accordance with the second selection signal. More specifically, a delay in the clock paths can be adjusted. In this manner, even in a case where there is a difference in the delay characteristics of the data paths and the clock paths between the flip-flops, the delays can be precisely achieved in the monitor circuit in a simulated manner. Accordingly, the presence or absence of a hold error in a path critical to hold errors of an actual operation circuit can be confirmed with a replica delay monitor having such a monitor circuit.

According to another aspect of the present disclosure, a semiconductor integrated circuit includes: a monitor circuit having first and second flip-flops, the monitor circuit being configured to determine presence or absence of a data propagation error in a critical path that is implemented in a simulated manner between the first and second flip-flops and output an output signal indicating a determination result; and an output holding circuit configured to hold an output signal of the monitor circuit for multiple times of determinations, and when the held output signals each indicate the absence of a data propagation error, determine that data has been properly propagated in the monitor circuit.

According to this aspect, in the monitor circuit, the presence or absence of a data propagation error in the critical path that is implemented between the first and second flip-flops in a simulated manner is determined, and an output signal indicating the determination result is output. The output holding circuit holds an output signal of the monitor circuit for multiple times of determinations, and when the held output signals each indicate the absence of a data propagation error, determines that data has been properly propagated in the monitor circuit. More specifically, in a case where the multiple times of determinations all indicate the absence of a data propagation error, it is determined that data has been properly propagated. In this manner, erroneous judgment can be prevented even if the flip-flops of the monitor circuit become metastable states and an output signal indicating the absence of a data propagation error is erroneously output.

According to another aspect of the present disclosure, a semiconductor integrated circuit includes a monitor circuit configured to determine presence or absence of a data propagation error, the monitor circuit including: a first flip-flop; a data delay circuit configured to delay a data signal that is an output of the first flip-flop; and a second flip-flop having a data input terminal receiving an output signal of the data delay circuit, and the data delay circuit including: a plurality of data paths each configured to delay the data signal; and a data selection circuit configured to select any one from among the plurality of data paths in accordance with a selection signal, and output the data signal that has transmitted through a selected data path, the data delay circuit including, as elements constituting the plurality of data paths: a first delay unit including a plurality of paths having a wiring formed in a first wiring layer as a delay element; and a second delay unit including a plurality of paths having a wiring formed in a second wiring layer different from the first wiring layer as a delay element, and the data selection circuit including: a first selection unit configured to select any one from among the plurality of paths belonging to the first delay unit; and a second selection unit configured to select any one from among the plurality of paths belonging to the second delay unit.

According to this aspect, the first delay unit including the plurality of paths having the wiring formed in the first wiring layer as the delay element and the second delay unit including the plurality of paths having the wiring formed in the second wiring layer different from the first wiring layer as the delay element are provided in the data delay circuit between the first and second flip-flops. Furthermore, any one from among the plurality of paths belonging to the first delay unit is selected, and any one from among the plurality of paths belonging to the second selection unit is selected. In this manner, a wiring delay can be independently set in the first wiring layer and the second wiring layer, and thus a critical path that is composed throughout a plurality of wiring layers in an actual operation circuit can be precisely implemented in a simulated manner.

According to the present disclosure, the presence or absence of a hold error in a path critical to hold errors of an actual operation circuit can be confirmed by a replica delay monitor equipped in a semiconductor integrated circuit. In addition, erroneous judgment due to a metastable state of a flip-flop can be prevented. Moreover, a critical path that is composed throughout a plurality of wiring layers in an actual operation circuit can be precisely implemented in a simulated manner.

DETAILED DESCRIPTION

Hereinafter, embodiments will be explained with reference to the drawings.

Figure 1:
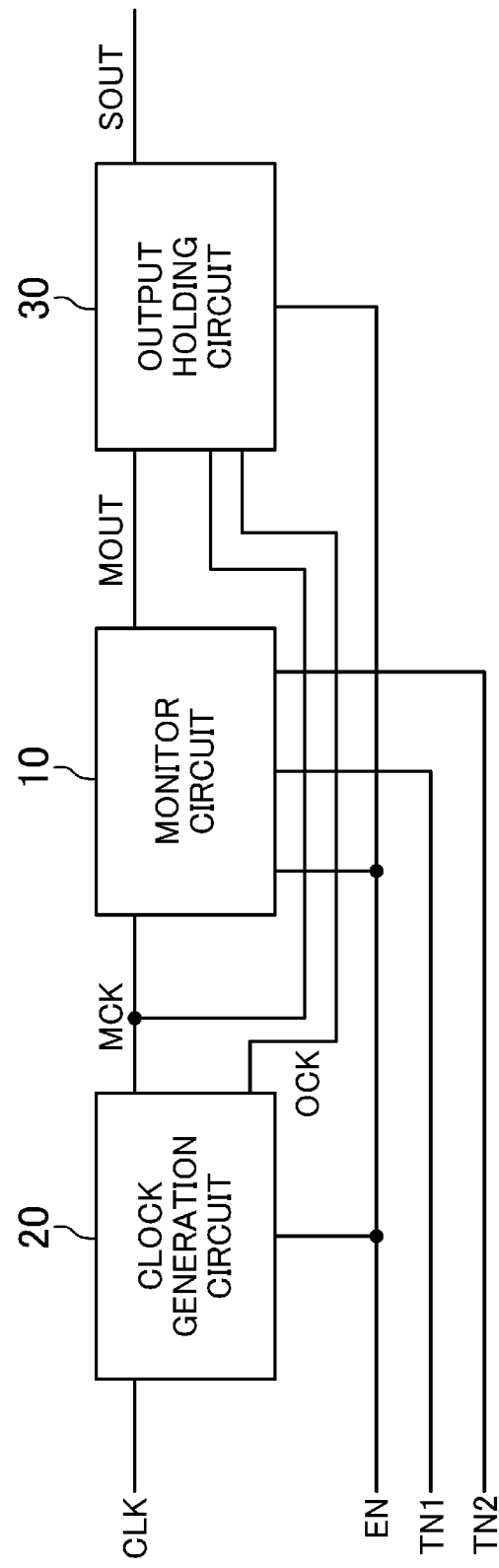
FIG. 1 is an overall configuration example of a replica delay monitor according to the present embodiment.

FIG. 1 is an overall configuration example of a replica delay monitor equipped in a semiconductor integrated circuit. A replica delay monitor 1 is capable of implementing a critical path in an actual operation circuit of a semiconductor integrated circuit in a simulated manner, and this is a circuit that monitors a timing margin in the critical path to determine the presence or absence of a data propagation error. The replica delay monitor 1 in FIG. 1 includes a monitor circuit 10, a clock generation circuit 20, and an output holding circuit 30.

The monitor circuit 10 is capable of setting an operation equivalent to a delay operation of the critical path, and it monitors the presence or absence of a data propagation error in the critical path. In the present embodiment, the monitor circuit 10 determines the presence or absence of a hold error in a critical path to hold errors. The clock generation circuit 20 generates a clock MCK for monitor operation from an original clock CLK, and supplies the generated clock MCK to the monitor circuit 10. The output holding circuit 30 holds an output MOUT of the monitor circuit 10 for multiple times, and outputs an output SOUT that indicates OK/NG regarding hold errors. Setting appropriate power voltage based on the output SOUT, i.e., the determination result by the replica delay monitor, successfully optimizes power consumption of the semiconductor integrated circuit.

Hereinafter, specific configuration examples of each of the circuits will be explained.

Figure 2:
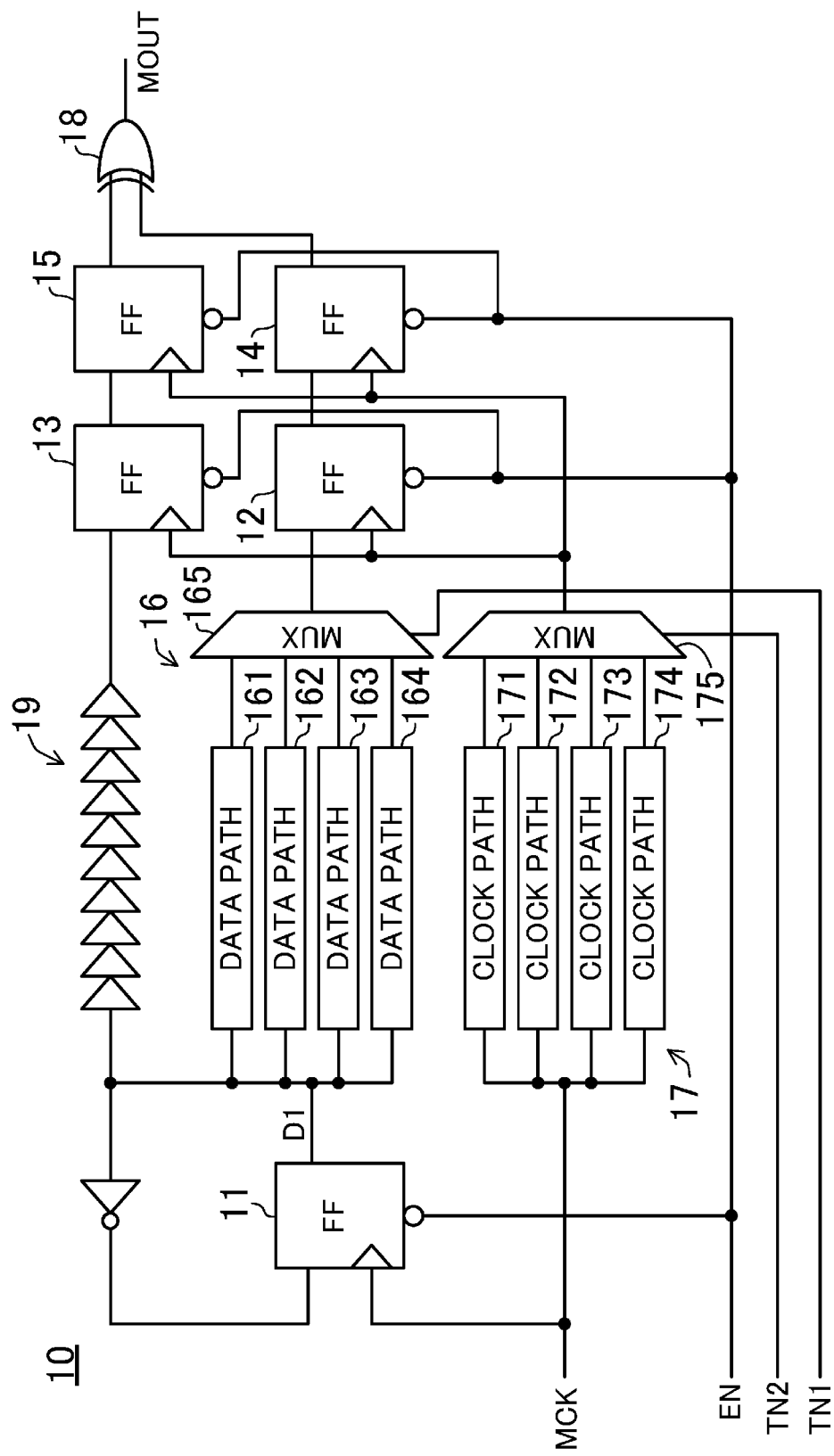
FIG. 2 is a configuration example of a monitor circuit in the replica delay monitor in FIG. 1.

FIG. 2 is an example of a circuit configuration of the monitor circuit 10. In the circuit configuration illustrated in FIG. 2, the monitor circuit 10 includes flip-flops 11-15, a data delay circuit 16, a clock delay circuit 17, and an EXOR gate 18. The flip-flop 11 acting as a first flip-flop has clock terminal receiving a clock MCK as a first clock signal. In addition, the flip-flop 11 has a data input terminal receiving an inversion signal of a first data signal D1 from the flip-flop 11 itself. In this manner, the flip-flop 11 repeatedly outputs high and low as the first data signal D1, for each rising edge of the clock MCK.

The data delay circuit 16 is a circuit that delays the first data signal D1, which is the output of the flip-flop 11, and is capable of changing the delay amount using a first selection signal TN1. The data delay circuit 16 includes a plurality of data paths 161-164 each of which delays the first data signal D1, and a multiplexer 165 that selects any one from among the plurality of data paths 161-164 in accordance with the first selection signal TN1 and outputs the first data signal D1 that has transmitted through the selected data path. The output selected by the multiplexer 165, which is an example of the data selection circuit, is an output signal of the data delay circuit 16. It should be noted that the plurality of data paths 161-164 may be any given circuit elements such as inverters, or may be any given wiring elements. In addition, the data paths 161-164 may be a combination of circuit elements and wiring elements. Furthermore, although a configuration in which the four data paths 161-164 are provided is shown herein, the number of data paths to be provided in the data delay circuit 16 is not limited to four.

The clock delay circuit 17 is a circuit that delays the clock MCK, and is capable of changing the delay amount by a second selection signal TN2. The clock delay circuit 17 includes a plurality of clock paths 171-174 each of which delays the clock MCK, and a multiplexer 175 that selects any one from among the plurality of clock paths 171-174 in accordance with the second selection signal TN2 and outputs the clock MCK that has transmitted through a selected clock path. The output selected by the multiplexer 175, which is an example of the clock selection circuit, is an output signal of the clock delay circuit 17. It should be noted that the clock paths 171-174 may be circuit elements such as inverters, or may be wiring elements. In addition, the clock paths 171-174 may be a combination of circuit elements and wiring elements. Furthermore, although a configuration in which the four clock paths 171-174 are provided is shown herein, the number of clock paths to be provided in the clock delay circuit 17 is not limited to four.

The flip-flop 12 as a second flip-flop has (i) a data input terminal receiving an output signal of the data delay circuit 16, and (ii) a clock terminal receiving an output signal of the clock delay circuit 17. More specifically, the flip-flop 12 holds a signal (i.e., the first data signal D1 output from the flip-flop 11 and delayed by the data delay circuit 16) with the timing of a clock signal (i.e., the clock MCK delayed by the clock delay circuit 17). If there is no hold error, the output of the flip-flop 12 and the first data signal D1 coincide with each other.

The flip-flop 13 as a third flip-flop has a data input terminal receiving the first data signal D1, which is the output signal of the flip-flop 11. A delay buffer 19 is inserted between the data output terminal of the flip-flop 11 and the data input terminal of the flip-flop 13. The delay buffer 19 sufficiently delays signals as compared to the clock delay circuit 17. Thus, the first data signal D1 is properly propagated to the flip-flop 13. More specifically, the output of the flip-flop 13 is the same as the signal to be propagated from the flip-flop 11 to the flip-flop 12, i.e., the first data signal D1. If the output of the flip-flop 12 and the output of the flip-flop 13 coincide with each other, it can be determined that a hold error is not occurring in data propagation from the flip-flop 11 to the flip-flop 12.

The flip-flop 14 receives the output of the flip-flop 12, and the flip-flop 15 receives the output of the flip-flop 13. The flip-flop 14 is provided to set an output to high or low, even in a case where the flip-flop 12 is in a metastable state. The flip-flop 15 is provided to match the flip-flop 14 with the timing of the data output. The XOR (exclusive OR) gate 18 receives outputs of the flip-flops 14, 15 as inputs. An output MOUT of the XOR gate 18 becomes low when the outputs of the flip-flops 14, 15 are coincident, that is, when data is properly propagated from the flip-flop 11 to the flip-flop 12, while it becomes high when the outputs of the flip-flops 14, 15 are not coincident, that is, when data is not properly propagated from the flip-flop 11 to the flip-flop 12. The XOR gate 18 is an example of the determination circuit that determines whether the output signal of the flip-flop 12 and the output signal of the flip-flop 13 coincide with each other.

Figure 3:
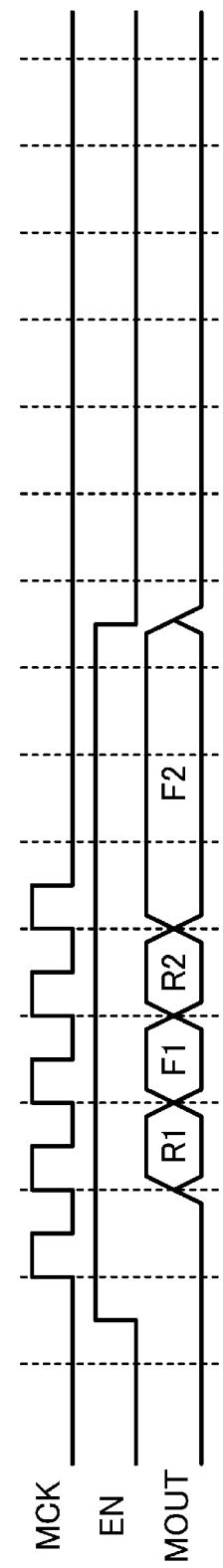
FIG. 3 is a timing diagram illustrating an operation example of the monitor circuit in FIG. 2.

FIG. 3 is a timing diagram illustrating an operation example of the monitor circuit 10 in FIG. 2. In the present embodiment, the clock MCK of five clocks is given after an enable signal EN is set high. The enable signal EN is given to the flip-flops 11-15 as a reset input, and when the enable signal EN becomes high, the reset state is released and the flip-flops 11-15 perform operations. Then, determinations are made two times in each of a case where the output of the flip-flop 11 transits from low to high (R1, R2) and a case where the output of the flip-flop 11 transits from high to low (F1, F2), and the results are serially output as output signals MOUT.

In this monitor circuit 10, a critical path to hold errors in the actual operation circuit within the semiconductor integrated circuit can be implemented in a simulated manner by setting a delay in the data delay circuit 16 with the first selection signal TN1 and setting a delay in the clock delay circuit 17 with the second selection signal TN2. Furthermore, by determining the presence or absence of a data propagation error in this critical path critical, to hold errors, that is implemented in a simulated manner, that is, a hold error herein, the presence or absence of a hold error in the actual operation circuit within the semiconductor integrated circuit can be determined.

It should be noted that the data delay circuit 16 includes, but not limited to, the plurality of data paths 161-164 and the multiplexer 165. Alternatively, the data delay circuit 16 may have any given as long as the data delay circuit 16 can adjust the delay amount. In addition, the clock delay circuit 17 includes, but not limited to, the plurality of data paths 171-174 and the multiplexer 175. Alternatively, the clock delay circuit 17 may have any given configuration as long as the clock delay circuit 17 can adjust the delay amount.

In addition, the flip-flop 11 receives a signal in which the output D1 is inverted. Alternatively, the method of supplying a data signal to the flip-flop 11 is not limited to such a technique. For example, the flip-flop 11 may receive the data signal from the outside of the monitor circuit 10.

Furthermore, the flip-flops 14, 15 may be omitted in the configuration of FIG. 2. In this case, the EXOR gate 18 receives the outputs of the flip-flops 12, 13 as inputs. However, since the flip-flops 12, 13 may become metastable states and an erroneous determination may occur, it is preferable to provide the flip-flops 14, 15 to avoid such a problem.

Figure 4:
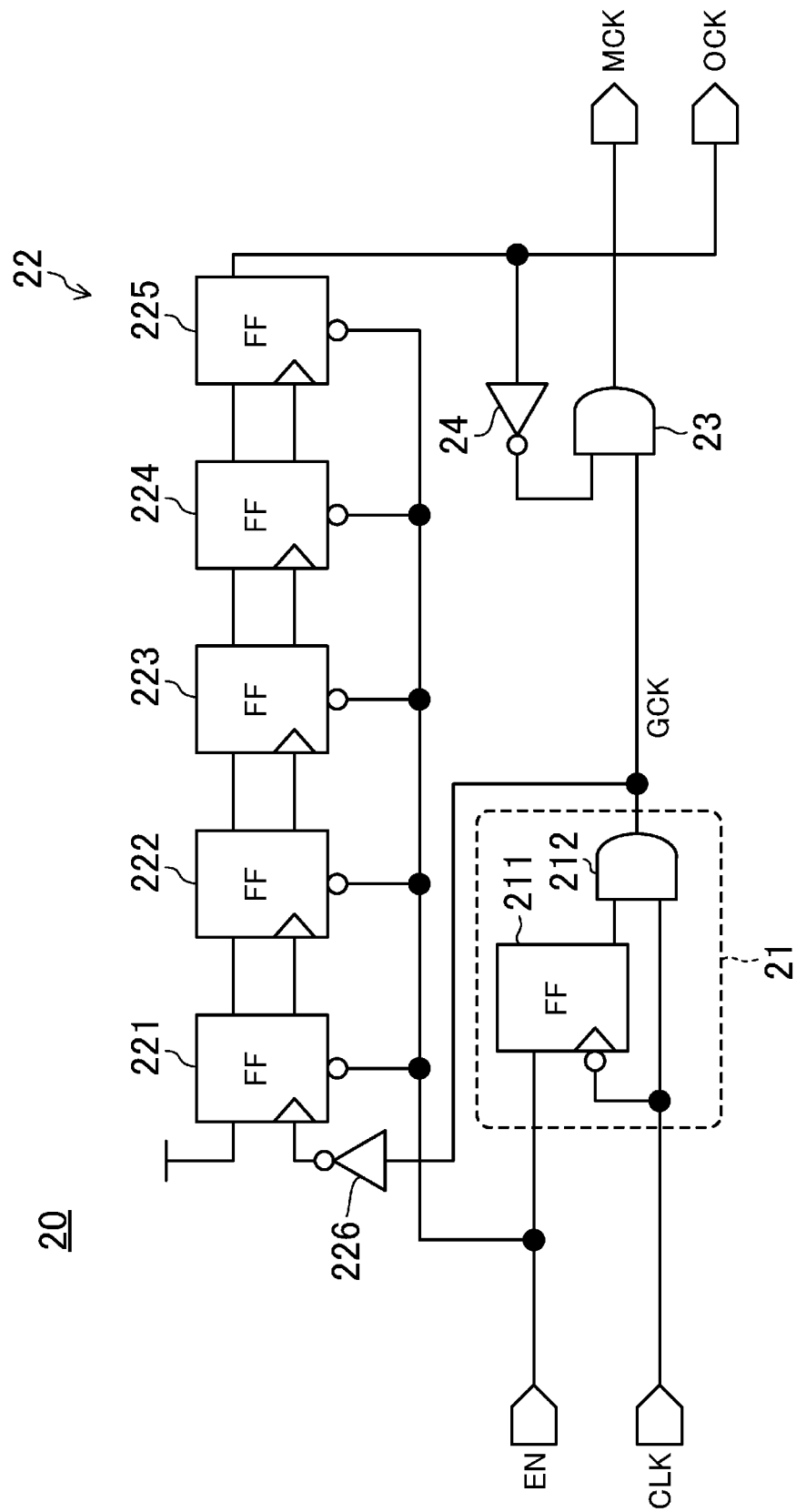
FIG. 4 is a configuration example of a clock generation circuit in the replica delay monitor in FIG. 1.

FIG. 4 is an example of a circuit configuration of the clock generation circuit 20. In the circuit configuration illustrated in FIG. 4, the clock generation circuit 20 includes a clock gating circuit 21, a shift register 22, an AND gate 23, and inverters 24, 226.

The clock gating circuit 21 allows the given original clock CLK to pass through as a clock GCK while the enable signal EN is high. The clock gating circuit 21 includes a flip-flop 211 that receives the enable signal EN as a data input and receives the original clock CLK as an inverted clock input, and an AND gate 212 that receives the output of the flip-flop 211 and the original clock CLK as two outputs.

The shift register 22 includes five flip-flops 221-225 that are connected in series. The flip-flops 221-225 receive, as a clock input, the clock GCK inverted by the inverter 226. In addition, the flip-flops 221-225 receive the enable signal EN as a reset input. The output of the shift register 22 is output from the clock generation circuit 20 as a signal OCK. In addition, the AND gate 23 receives as two inputs the signal OCK inverted by the inverter 24 and the clock GCK. The output of the AND gate 23 is output from the clock generation circuit 20 as the clock MCK.

Figure 5:
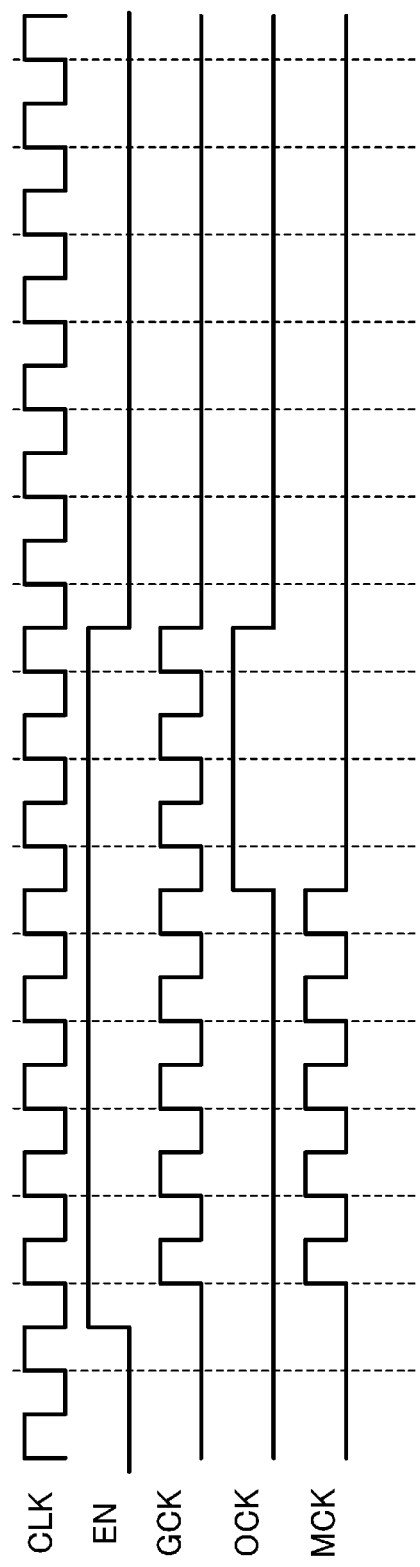
FIG. 5 is a timing diagram illustrating an operation example of the clock generation circuit in FIG. 4.

FIG. 5 is a timing diagram illustrating an operation example of the clock generation circuit 20 in FIG. 4. When the enable signal EN becomes high, the clock gating circuit 21 allows the original clock CLK to pass through, and starts output of a clock pulse as the clock GCK. At this time, since the output of the shift register 22, i.e., the signal OCK, is low, the clock pulse is output as the clock MCK via the AND gate 23. In addition, when the shift register 22 operates in accordance with the clock GCK, and a fifth clock pulse of the clock GCK is generated, the output of the shift register 22, i.e., the signal OCK, becomes high at the timing of the falling edge. When the signal OCK becomes high, the clock pulse of the clock MCK stops by the AND gate 23. When the enable signal EN becomes low, the signal OCK returns to low. Due to such operations, the clock generation circuit 20 can generate five clock pulses as the clock MCK.

It should be noted that the five clock pulses are generated as the clock MCK in order to perform determinations four times in the aforementioned monitor circuit 10. The number of clock pulses of the clock MCK should be changed in accordance with the number of determinations in the monitor circuit 10. For example, in the circuit configuration of FIG. 4, the number of clock pulses of the clock MCK can be changed by changing the number of flip-flops of the shift register 22. In addition, FIG. 4 is an example of the clock generation circuit 20, and this circuit may be implemented with any circuit as long as it generates a predetermined number of clock pulses as the clock MCK.

Figure 6:
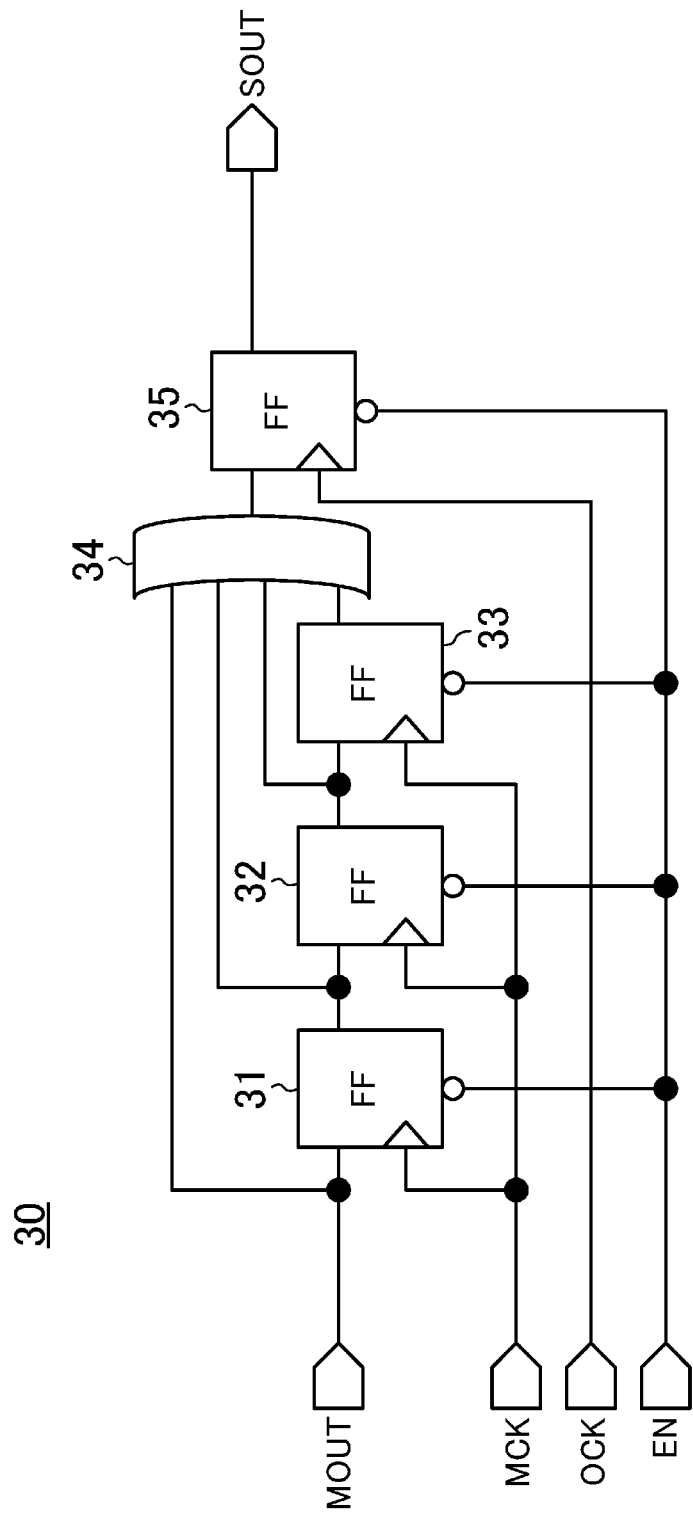
FIG. 6 is a configuration example of an output holding circuit in the replica delay monitor in FIG. 1.

FIG. 6 is an example of a circuit configuration of the output holding circuit 30. In the circuit configuration illustrated in FIG. 6, the output holding circuit 30 includes flip-flops 31-33, a four-input OR gate 34, and a flip-flop 35. The output holding circuit 30 receives the clock MCK, OCK from the clock generation circuit 20, and receives an output signal MOUT indicating the determination result from the monitor circuit 10.

The flip-flops 31-33 are connected in series. Each of the lip-flops 31-33 receives the clock MCK as a clock input while receiving the enable signal EN as a reset input. In addition, the flip-flop 31 receives the output signal MOUT as a data input. The four-input OR gate 34 receives the output signal MOUT and each of the outputs of the flip-flops 31-33 as four inputs. The flip-flop 35 receives the output of the four-input OR gate 34 as a data input. In addition, the flip-flop 35 receives the clock OCK as a clock input and receives the enable signal EN as a reset input. The output of the flip-flop 35 becomes an output signal SOUT of the output holding circuit 30.

Figure 7:
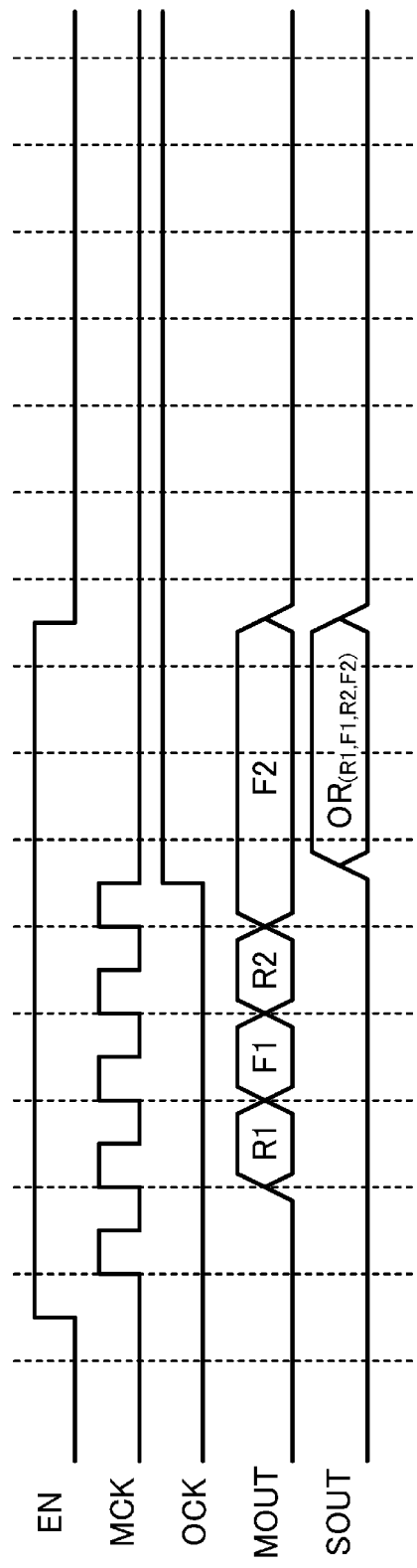
FIG. 7 is a timing diagram illustrating an operation example of the output holding circuit in FIG. 6.

FIG. 7 is a timing diagram illustrating an operation example of the output holding circuit 30 in FIG. 6. The enable signal EN becomes high, and five clock pulses are input as the clock MCK, while determination results of four times are input as the output signal MOUT from the monitor circuit 10. Due to the input of the clock OCK, the OR of the determination results of four times in the monitor circuit 10 is output as the output signal SOUT.

In this circuit configuration, when the output signals MOUT indicating the determination results of four times in the monitor circuit 10 are all low, the output signal SOUT will be low, and in other cases, the output signal SOUT will be high. More specifically, only in a case where the determination results of four times in the monitor circuit 10 all indicate the absence of a hold error, the output holding circuit 30 outputs low as the output signal SOUT, and judges that data has been properly propagated in the monitor circuit 10. In this manner, even in a case where a metastable state has occurred in the flip-flop 12 of the monitor circuit 10, for example, the output holding circuit 30 can reduce the risk of erroneous determination that data has been properly propagated.

It should be noted that the circuit configuration in FIG. 6 is for determining whether data has been properly propagated from the determination results of four times by the monitor circuit 10. For example, in the circuit configuration of FIG. 6, the number of inputs of the OR gate 34 and the number of flip-flops in the preceding stage are changed so that whether the data has been properly propagated can be determined based on the results of determinations carried out other than four times. In addition, FIG. 6 is an example of the output holding circuit 30, and this circuit may be implemented in the form of any given circuit as long as the output holding circuit 30 determines whether data has been properly propagated based on the results of determinations carried out by a predetermined number of times by the monitor circuit 10.

Figure 8:
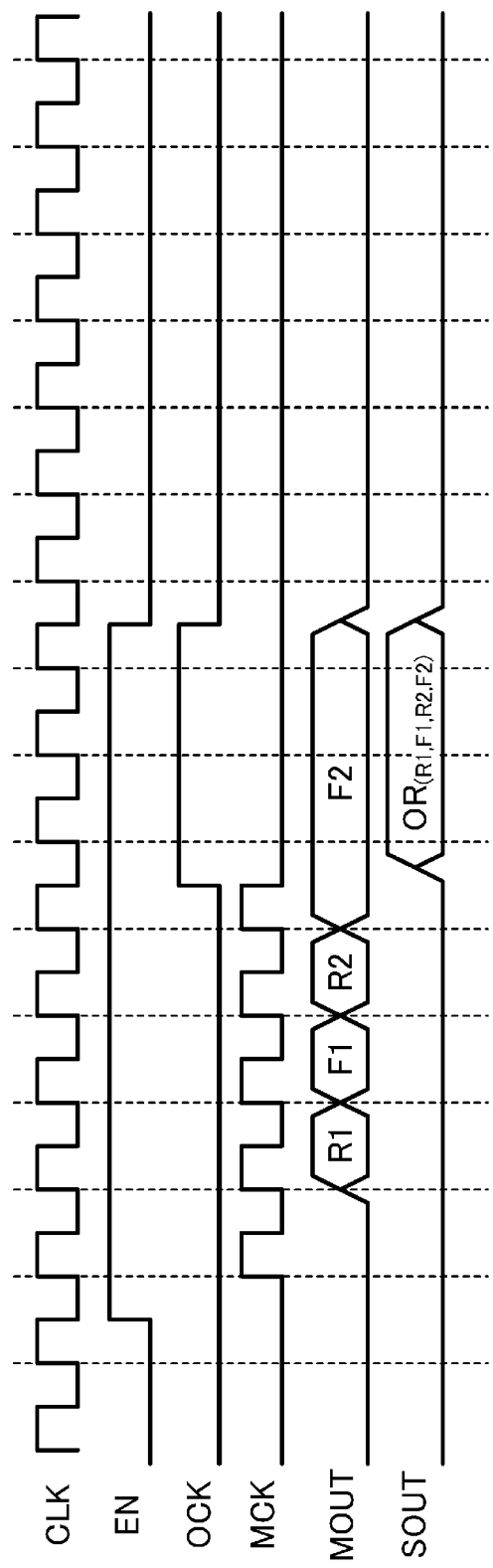
FIG. 8 is a timing diagram illustrating an operation of the overall configuration in FIG. 1.

FIG. 8 is a timing diagram illustrating an overall operation of the replica delay monitor in FIG. 1. As can be understood from FIG. 8, when the original clock CLK is given in the configuration in FIG. 1, the output signal SOUT is output. Here, the output signal SOUT indicates a result of determination indicating whether data has been properly propagated based on the determination results MOUT of four times in the monitor circuit 10, is output.

As described above, according to the present embodiment, the first data signal D1 is propagated from the first flip-flop 11 to the second flip-flop 12 via the data delay circuit 16 in the monitor circuit 10. In addition, the clock MCK that is input to the first flip-flop 11 is input to the second flip-flop 12 via the clock delay circuit 17. Furthermore, each of a delay in the data path and a delay in the clock path can be adjusted between the flip-flops 11, 12. In this manner, even in a case where there is a difference in the delay characteristics of the data path and the clock path between the flip-flops 11, 12, the delays can be precisely achieved in a simulated manner in the replica delay monitor 1. Accordingly, the presence or absence of a hold error in the path critical to hold errors of the actual operation circuit can be confirmed with the replica delay monitor 1. As a result, taking hold errors into the consideration, the voltage can be controlled in the most suitable manner in the semiconductor integrated circuit.

In addition, the output holding circuit 30 holds an output signal of the monitor circuit 10 for multiple times of determinations, and when the held output signals each indicate the absence of a data propagation error, determines that data has been properly propagated in the monitor circuit 10. More specifically, in a case where the multiple times of determinations all indicate the absence of a data propagation error, the output holding circuit 30 determines that data has been properly propagated. In this manner, erroneous judgment can be prevented even if a flip-flop of the monitor circuit 10 becomes a metastable state and an output signal indicating the absence of a data propagation error is erroneously output.

It should be noted that the output holding circuit 30 is not only applied to a monitor circuit that can confirm the presence or absence of a hold error such as the monitor circuit 10. For example, the output holding circuit 30 disclosed herein can also be applied to a conventional monitor circuit that can confirm the presence or absence of a setup error.

<Specific Configuration Example of Delay Circuit>

Figure 9:
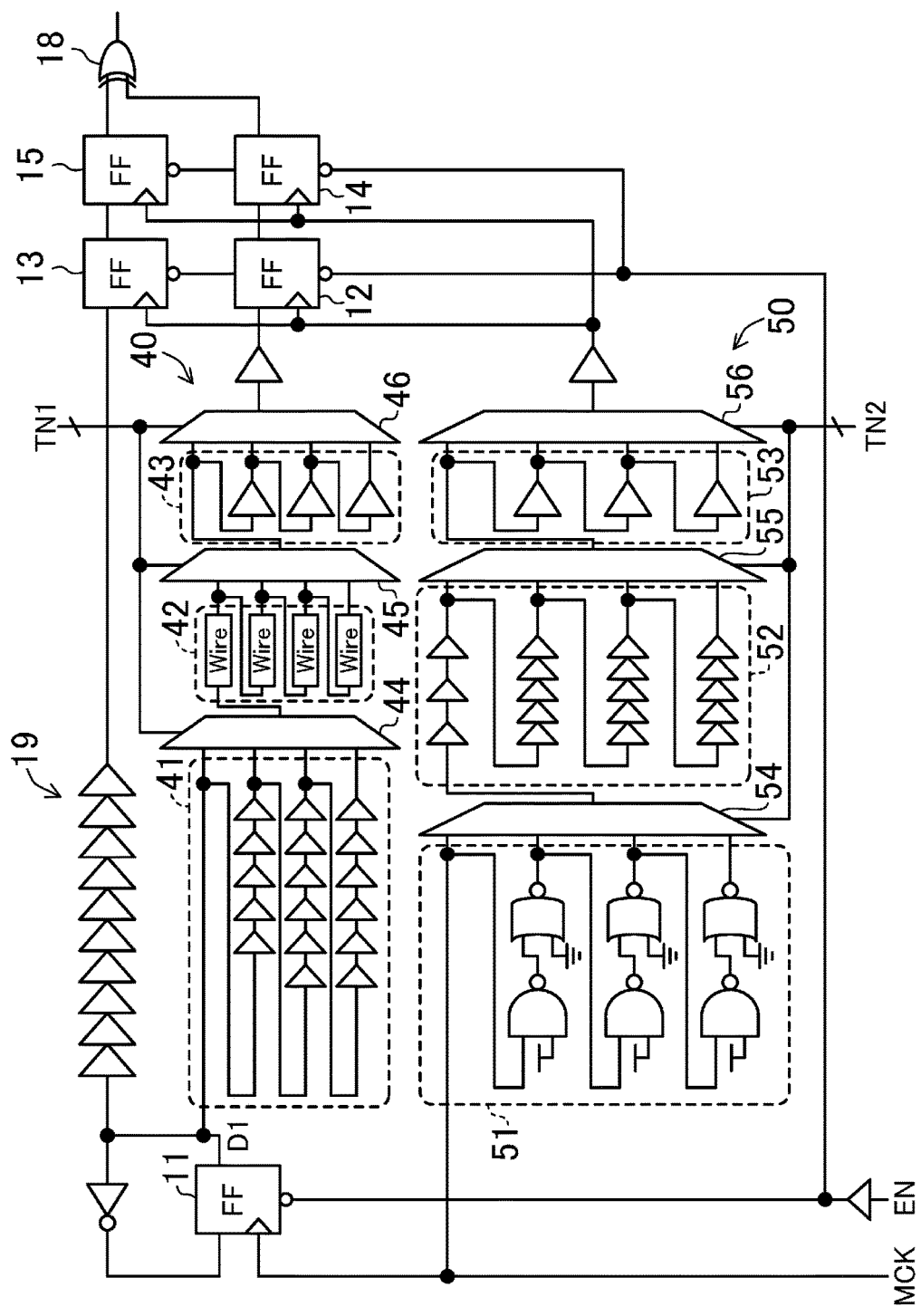
FIG. 9 is a figure illustrating a specific configuration example of a delay circuit.

FIG. 9 is a figure more specifically illustrating the data delay circuit and the clock delay circuit in the monitor circuit 10 of FIG. 2. In the configuration of FIG. 9, a data delay circuit 40 is provided instead of the data delay circuit 16, and a clock delay circuit 50 is provided instead of the clock delay circuit 17. Other constituent elements are basically the same as those in FIG. 2.

The data delay circuit 40 includes three data path units 41, 42, 43 and multiplexers 44, 45, 46 corresponding to each of the data path units 41, 42, 43. The data path unit 41 includes four data paths containing buffers and having different delay amounts from one another. The multiplexer 44 selects any of the four data paths of the data path unit 41 in accordance with the first selection signal TN1. The data path unit 42 includes four data paths containing wiring elements and having different delay amounts from one another. The multiplexer 45 selects any of the four data paths of the data path unit 42 in accordance with the first selection signal TN1. The data path unit 43 includes four data paths containing buffers and having different delay amounts from one another. The multiplexer 46 selects any of the four data paths of the data path unit 43 in accordance with the first selection signal TN1. Due to this configuration, any one of 64 (=4×4×4) types of data paths is selected in the data delay circuit 40, and the first data signal D1, which is the output of the flip-flop 11, can be delayed to be given to the flip-flop 12.

The clock delay circuit 50 includes three clock path units 51, 52, 53 and multiplexers 54, 55, 56 corresponding to each of the clock path units 51, 52, 53. The clock path unit 51 includes four clock paths containing an NAND gate and an NOR gate and having different delay amounts from one another. The multiplexer 54 selects any of the four data paths of the clock path unit 51 in accordance with the second selection signal TN2. The clock path unit 52 includes four data paths containing buffers and having different delay amounts from one another. The multiplexer 55 selects any of the four clock paths of the clock path unit 52 in accordance with the second selection signal TN2. The clock path unit 53 includes four clock paths containing buffers and having different delay amounts from one another. The multiplexer 56 selects any of the four clock paths of the clock path unit 53 in accordance with the second selection signal TN2. Due to this configuration, any one of 64 (=4×4×4) types of clock paths is selected in the clock delay circuit 50, and the clock MCK can be delayed to be given to the flip-flop 12.

In the configuration example of FIG. 9, the data delay circuit 40 includes the data path units 41, 43, which correspond to gate delay units having a gate constituting a circuit function as a delay element, and the data path unit 42, which corresponds to a wiring delay unit not having a gate but having a wiring as a delay element, as elements constituting the plurality of data paths. It should be noted that although the wiring delay unit not having a gate but having a wiring as a delay element is not provided for the clock delay unit 50 in the configuration example of FIG. 9, the wiring delay unit may be provided.

Hereinafter, an improvement example regarding the wiring delay unit will be explained.

<Improvement Examples Regarding Wiring Delay Unit>

First Example

Figure 10:
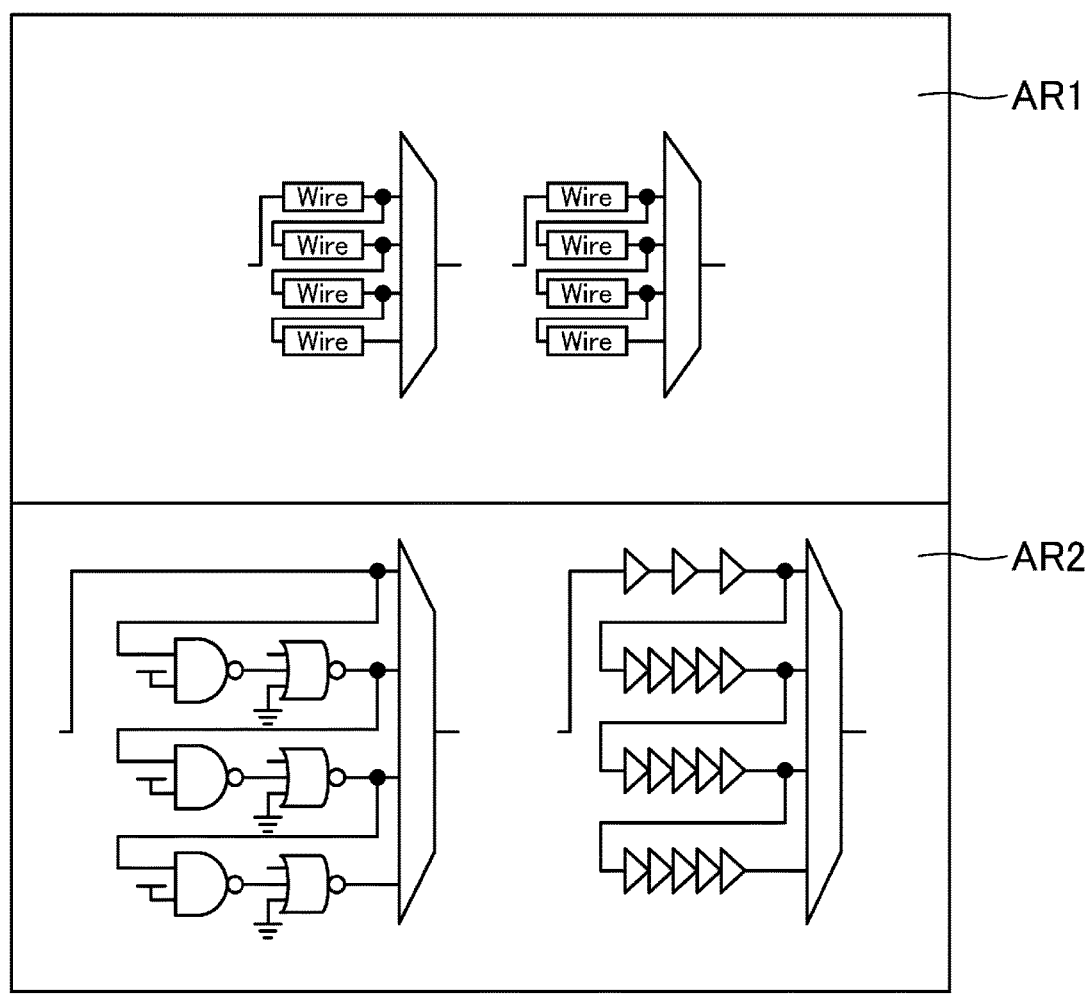
FIG. 10 is an example illustrating how a wiring delay unit is improved.

In a configuration as in FIG. 9, there may be a problem in that an ideal wiring delay cannot be reproduced due to an influence of noise of the gate delay unit on the wiring delay unit. Thus, illustrated in FIG. 10 is a layout in which regions of the wiring delay unit and the gate delay unit are lay out separately. In FIG. 10 of the layout of the semiconductor integrated circuit, a first region AR1 provided with the wiring delay unit and a second region AR2 provided with the gate delay unit. The first region AR1 and the second region AR2 are arranged so as not to have an overlap in planar view. In this manner, a mutual influence between the wiring delay unit and the gate delay unit is suppressed, and thus desired delay characteristics can be obtained.

Second Example

Figure 11:
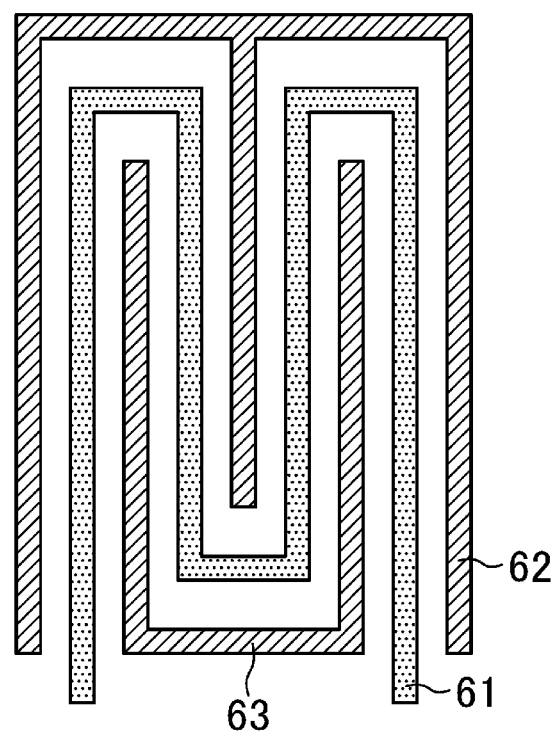
FIG. 11 is an example illustrating how a wiring delay unit is improved.

In the wiring delay unit, there may be a problem in that an ideal wiring delay cannot be reproduced due to an influence of crosstalk between wirings. Thus, as illustrated in FIG. 11, shield wirings 62, 63 are provided around a wiring 61 constituting the wiring delay unit. The shield wirings 62, 63 are fixed to, for example, ground potential. In this manner, an influence of crosstalk between wirings is reduced by the shield wiring 62, 63, and thus desired delay characteristics can be obtained.

Third Example

Figure 12:
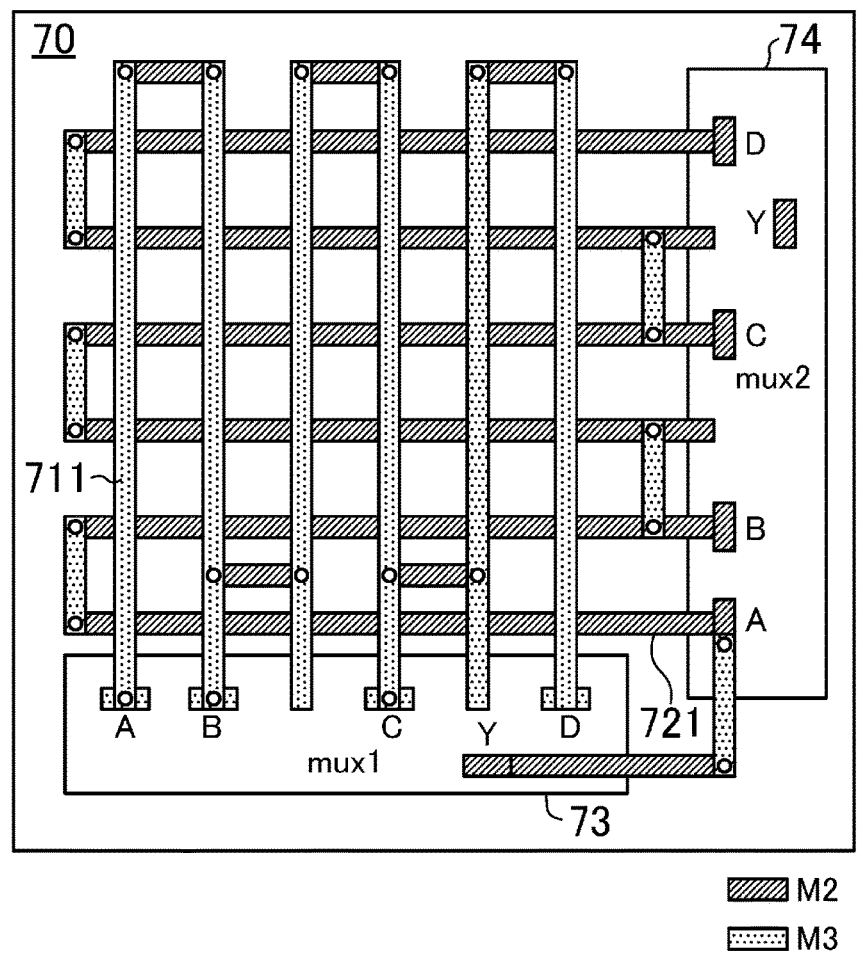
FIG. 12 is an example of a layout of a wiring delay unit.
Figure 13:
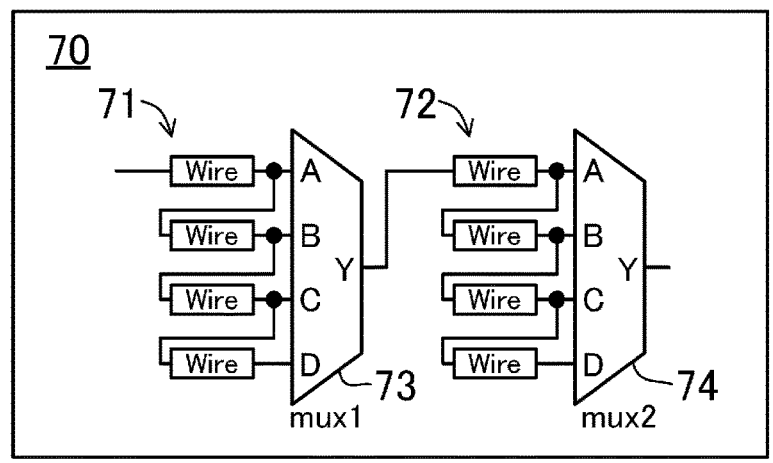
FIG. 13 is a circuit configuration of the wiring delay unit in FIG. 12.

FIG. 12 is an example of a layout of the wiring delay unit, and FIG. 13 is a circuit configuration thereof. A wiring delay unit 70 illustrated in FIG. 12 and FIG. 13 includes a first delay unit 71 including a plurality of paths having a wiring 711 formed in a wiring layer M3 as a delay element and a second delay unit 72 including a plurality of paths having a wiring 721 formed in a wiring layer M2 as a delay element. A multiplexer 73 as a first selection unit selects any one from among the plurality of paths belonging to the first delay unit 71. A multiplexer 74 as a second selection unit selects any one from among the plurality of paths belonging to the second delay unit 72.

In this regard, it is favorable that the monitor circuit can precisely implement a wiring delay in the critical path in the actual operation circuit of the semiconductor integrated circuit in a simulated manner. However, the wiring of the critical path does not necessarily consist of a single-layer wiring, and it may consist of a multilayer wiring. Since characteristics of resistance and capacitance of a wiring may differ depending on the layer, in order to precisely achieve a wiring delay in the critical path including the multilayer wiring in a simulated manner, it is favorable that a wiring delay can be set for each wiring layer also in the monitor circuit. In the wiring delay unit 70 illustrated in FIG. 12 and FIG. 13, a wiring delay can be independently set for each of the wiring layer M2 and the wiring layer M3. In this manner, the critical path, which is composed throughout the plurality of wiring layers in the actual operation circuit, can be implemented more precisely in a simulated manner.

According to the present disclosure, performance of a replica delay monitor equipped in a semiconductor integrated circuit can be improved. Thus, it is useful in, for example, reduction of power consumption of LSI.

What is claimed is:
1. A semiconductor integrated circuit, comprising:
a monitor circuit configured to determine presence or absence of a data propagation error,
the monitor circuit including:
a first flip-flop having a clock terminal receiving a first clock signal;
a data delay circuit configured to delay a first data signal that is an output of the first flip-flop;
a clock delay circuit configured to delay the first clock signal; and a second flip-flop having (i) a data input terminal receiving an output signal of the data delay circuit, and (ii) a clock terminal receiving an output signal of the clock delay circuit, the data delay circuit including:

a plurality of data paths each configured to delay the first data signal; and a data selection circuit configured to select a data path among the plurality of data paths in accordance with a first selection signal, and output the first data signal that has transmitted through the selected data path as an output signal of the data delay circuit, and the clock delay circuit including:

a plurality of clock paths each configured to delay the first clock signal; and a clock selection circuit configured to select a clock path among the plurality of clock paths in accordance with a second selection signal, and output the first clock signal that has transmitted through the selected clock path as an output signal of the clock delay circuit.

2. The semiconductor integrated circuit of claim 1, wherein the monitor circuit includes:

a third flip-flop having a data input terminal receiving the first data signal, and a clock terminal receiving an output signal of the clock delay circuit; and a determination circuit configured to determine whether an output signal of the second flip-flop and an output signal of the third flip-flop coincide with each other.

3. The semiconductor integrated circuit of claim 1, wherein the data delay circuit includes as elements constituting the plurality of data paths:

a gate delay unit having a gate constituting a circuit function as a delay element; and a wiring delay unit not having a gate but having a wiring as a delay element.

4. The semiconductor integrated circuit of claim 3, further comprising a first region provided with the wiring delay unit and a second region provided with the gate delay unit, the first region and the second region being arranged so as not to have an overlap in planar view.

5. The semiconductor integrated circuit of claim 3, wherein the wiring delay unit includes a wiring having a shield wiring provided around the wiring.

6. The semiconductor integrated circuit of claim 3, wherein the data delay circuit comprises as the wiring delay unit:

a first delay unit including a plurality of paths each having a wiring formed in a first wiring layer as a delay element; and a second delay unit including a plurality of paths each having a wiring formed in a second wiring layer different from the first wiring layer as a delay element, and the data selection circuit comprises:

a first selection unit configured to select any one from among the plurality of paths belonging to the first delay unit; and a second selection unit configured to select any one from among the plurality of paths belonging to the second delay unit.

7. The semiconductor integrated circuit of claim 1, wherein the monitor circuit outputs an output signal indicating a determination result, and the semiconductor integrated circuit comprises an output holding circuit that holds an output signal of the monitor circuit for multiple times of determinations, and when the held output signals each indicate the absence of a data propagation error, determines that data propagation has been properly performed in the monitor circuit.

8. A semiconductor integrated circuit, comprising:

a monitor circuit having first and second flip-flops, the monitor circuit being configured to determine presence or absence of a data propagation error in a critical path that is implemented in a simulated manner between the first and second flip-flops and output an output signal indicating a determination result; and an output holding circuit configured to hold an output signal of the monitor circuit for multiple times of determinations, and when the held output signals each indicate the absence of a data propagation error, determine that data propagation has been properly performed in the monitor circuit.

* * * * *